United States Patent [19]
Manofsky, Jr. et al.

[11] Patent Number: 6,068,016
[45] Date of Patent: May 30, 2000

[54] MODULAR FLUID FLOW SYSTEM WITH INTEGRATED PUMP-PURGE

[75] Inventors: William L. Manofsky, Jr., San Jose; Gary Curtis Fittro, Morgan Hill, both of Calif.

[73] Assignee: Applied Materials, Inc, Santa Clara, Calif.

[21] Appl. No.: 08/937,605

[22] Filed: Sep. 25, 1997

[51] Int. Cl.$^7$ ...................................................... F16K 11/00
[52] U.S. Cl. ........................... 137/269; 137/271; 137/884
[58] Field of Search .................................... 137/269, 884, 137/271, 560

[56] References Cited

U.S. PATENT DOCUMENTS

| | | | |
|---|---|---|---|
| 4,168,724 | 9/1979 | Graffunder et al. ................. | 137/884 X |
| 5,488,925 | 2/1996 | Kumada .............................. | 137/884 X |
| 5,605,179 | 2/1997 | Strong, Jr. et al. ..................... | 137/884 |
| 5,662,143 | 9/1997 | Caughran ............................ | 137/269 X |

*Primary Examiner*—Kevin Lee
*Attorney, Agent, or Firm*—Shirley L. Church

[57] ABSTRACT

This disclosure describes a modular, monolithic pump-purge system which can be integrated into a modular, monolithic fluid handling system without creating a closed tolerance loop. In particular, the pump-purge system comprises a plurality of valves mounted on a modular and monolithic manifold which can be attached to the modular, monolithic fluid handling system. At least a portion, and preferably all of the fluid transfer conduits necessary for either applying a vacuum (or other evacuation means) to a fluid handling system conduit which is to be evacuated (pumped), or for transfer of flushing fluid within a conduit (purging) are present within monolithic manifolds of the fluid handling system. The modular, monolithic manifold of the pump-purge system contains openings and fluid flow conduits which correspond with openings and fluid flow conduits of the modular, monolithic fluid handling system, to enable evacuation or flushing of a selected fluid flow conduit within the fluid handling system. To avoid the formation of a closed tolerance loop, it is necessary that the pump-purge manifold or a portion of the modular, monolithic fluid handling system manifold to which it is attached be sufficiently free-floating to permit making of all necessary connections without creating stress which can lead to an increased rate of corrosion or failure of the connection. In a preferred embodiment gas handling system, the gas handling flow lines which make up the system are comprised of individual sticks of gas handling elements, each of which is attached to the manifold of the pump-purge system so that it is free-floating.

16 Claims, 14 Drawing Sheets

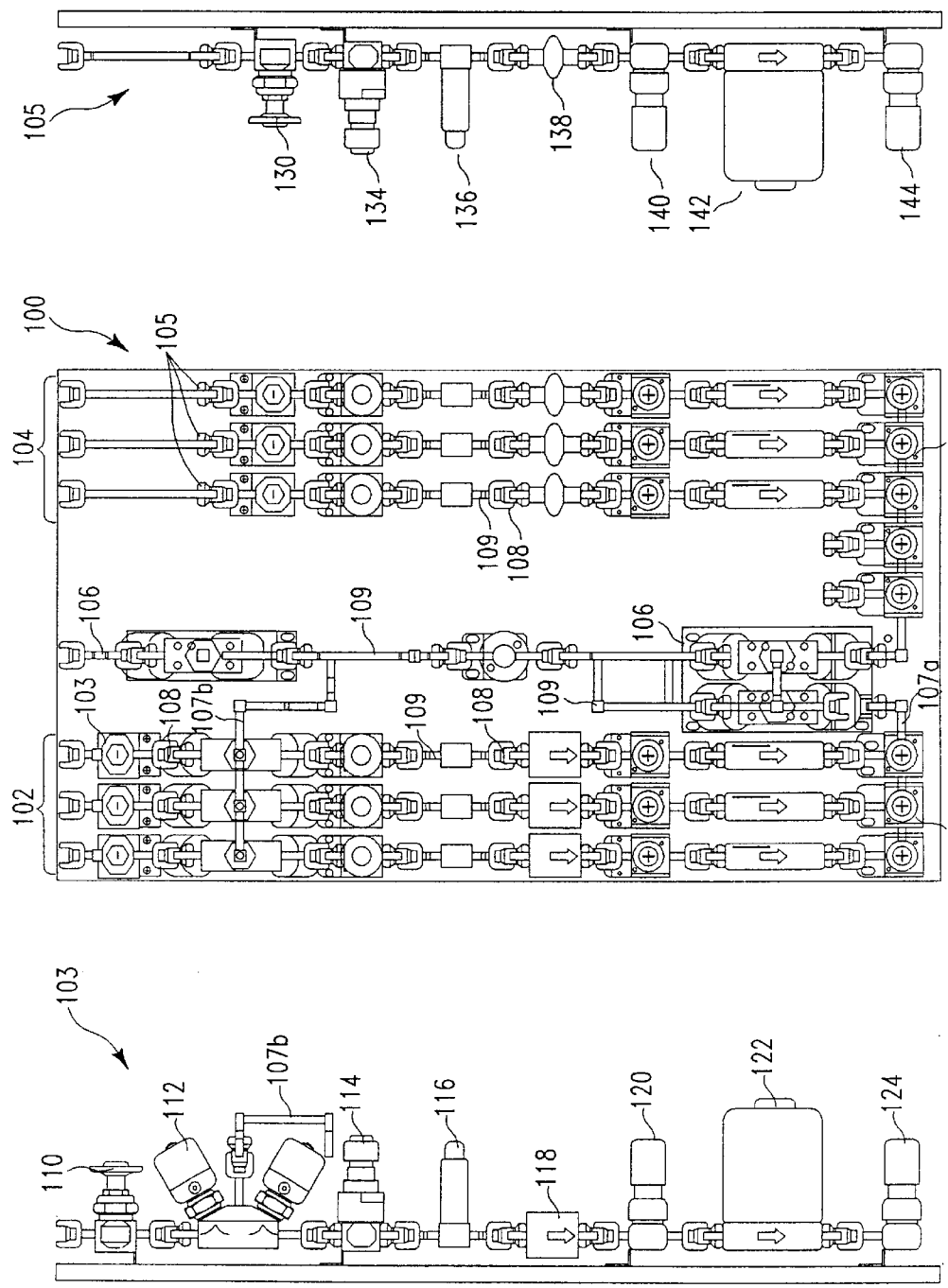

(A-A from FIG. 8)

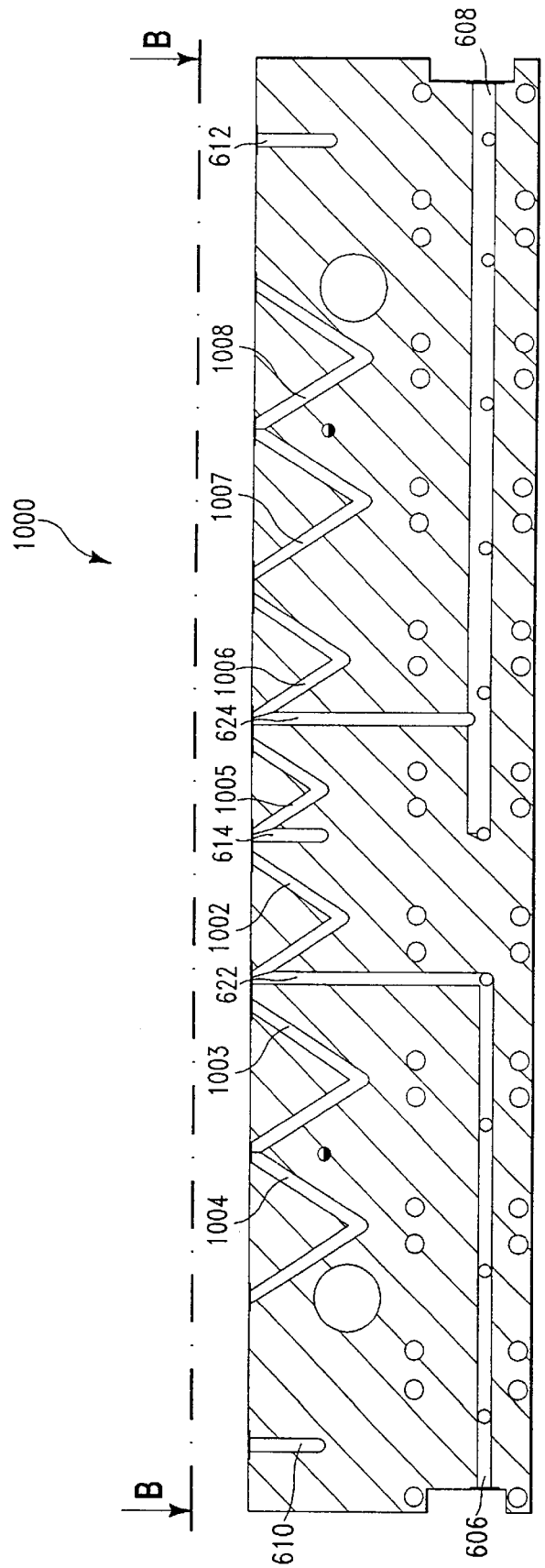
FIG. 10 (B-B from FIG. 8)

MODULAR FLUID FLOW SYSTEM WITH INTEGRATED PUMP-PURGE

BACKGROUND OF THE INVENTION

1. Field of the Invention

The present invention pertains to a new concept in fluid flow control systems such as gas flow control systems for use in semiconductor processing apparatus. Semiconductor processing utilizes inert, toxic, and corrosive gases which require the use of various flow control and filtering devices to ensure that the right quantity of contaminant-free gas reaches the semiconductor processing chamber. The control and filtering devices are assembled in clusters of elements which are typically mounted on a pallet for handling and maintenance purposes. The present disclosure makes possible the use of clusters of gas control and processing elements without the need for pipe fitting and plumbing activities which require special skill and which generate expensive down time. The general concepts involved are applicable to fluid flow systems in general.

2. Brief Description of the Background Art

There are numerous semiconductor processing steps which require the use of specialized gases. Some of these gases are inert gases such a nitrogen and argon which are generally used as diluent gases. Gases such as argon are also used for plasma creation in processes such as physical vapor deposition. In many instances the process gases are toxic or corrosive, or both. For example, in etch processing, commonly used gases include $Cl_2$, $BCl_3$, $CCl_4$, $SiCl_4$, $SF_6$, and $CF_4$. In chemical vapor deposition (CVD) processing, commonly used gases include $H_2$, $TiCl_4$, $SiH_4$, $MoCl_5$, $WCl_6$, and $Ta\ Cl_5$, for example. These gases require specialized handling equipment for transport, pressure reduction, filtering, mass flow control, gas mixing, and other known process-related functions.

U.S. Pat. No. 4,714,091 to Wilfried Wagner, issued Dec. 22, 1987, discloses a modular gas handling apparatus. The apparatus comprises modular flow block means, including a plurality of gas flow paths extending through the modular flow block means, to provide a plurality of port members on respective surfaces of the modular flow block means. There are a plurality of valve passages extending into the modular flow block means to provide gas flow paths at predetermined locations throughout the modular flow block means. Each of such plurality of valve passages includes an entrance aperture on a respective surface of the modular flow block means, a plurality of valve flange members, each of the valve flange members being adapted to mount a high vacuum valve on the modular flow block means at one of the entrance apertures without the need to apply rotational force the valve flange members, while providing a hermetic seal of the high vacuum valve onto the modular flow block means. In addition, each of the plurality of port members includes port member mounting means whereby conduits can be removably, hermetically sealed to the respective plurality of port members.

U.S. Pat. No. 5,188,148 to Brevard Garrison, issued Feb. 23, 1993, describes a plate structure including conduit and reagent delivery means for a fluid delivery system. The system is designed to deliver precise volumes of a plurality of fluids in sequence to a treatment reservoir. Fluid channels are formed in the plate structure to provide a means for delivering fluids from a plurality of fluid reservoirs attached to the plate structure. A partition switch is attached to the plate structure to direct fluid to the desired treatment reservoirs or pressure reservoirs.

U.S. patent application Ser. No. 08/564,466, of Manofsky Jr. et al., filed Nov. 29, 1995, and assigned to the assignee of the present application, describes flat bottom components and flat bottom architecture for fluid and gas systems. This patent application is hereby incorporated by reference in its entirety. In particular, flat bottom valves and other types of flat bottom components, such as, for example, instrumentation devices are attached to a monolithic structure having passages for interconnecting the flat bottom components.

The kinds of gas handling systems described above make it possible to use combinations of gas processing elements with minimal, if any, need to perform pipe fitting activities during installation, operation, and maintenance of the system. By pipe fitting it is meant the use of piping and tubing with various connection fittings and weldments, as generally known in the art. This has particular advantage in the semiconductor industry where, due to the corrosivity of many of the gases, frequent repair or replacement of gas handling and processing elements is required.

To be able to change out a particular element in a gas handling system when the gas which occupies the element (and conduits leading to that element) is toxic, corrosive, pyrophoric, or a combination of these, it is necessary to remove residual gas from the element and from the conduits leading to that element prior to opening the piping line and removing the element. Typically this is done by flushing out (purging) the element and associated piping with a flush gas, typically an inert gas, prior to opening the piping and removing the element. When minute concentrations of the gas may be harmful to the surrounding environment in general and/or to the person working to change out the element (hazardous), it may be necessary to use a vacuum to remove residual gas (to pump out the gas from the element), followed by purging with the flush gas, with this process repeated several times to provide for complete removal of the residual gas.

The same problems that occur with the maintenance of gas handling systems are applicable to fluids in general, including hazardous liquids. It would be highly desirable to have an apparatus which would provide for the removal of residual toxic, corrosive, or pyrophoric fluids from a fluid handling system of the kind described, where the apparatus requires minimal, if any, performance of traditional pipe fitting activities.

SUMMARY OF THE INVENTION

We have designed and constructed a pump-purge system which can be integrated into a modular/monolithic fluid handling system without creating a closed tolerance loop. In particular, the pump-purge system comprises a combination of valves mounted on a modular and monolithic manifold which can be attached to the modular/monolithic fluid handling system. At least a portion, and preferably all of the fluid transfer conduits necessary for applying a vacuum (or other evacuation means) to a fluid handling line within the gas handling system (pumping), or for transfer of flushing fluid (purging) within a fluid handling line of the modular/monolithic gas handling system are present within a monolithic manifold which is a part of the gas handling system. The modular and monolithic manifold of the pump-purge system contains fluid flow conduits which correspond with fluid flow conduits of the fluid handling system, and the pump-purge manifold has openings on at least one surface which are matched to openings in the fluid handling system to enable evacuation or flushing of a fluid within a selected fluid flow line of the fluid handling system when the pump-purge manifold is attached. To avoid the formation of a closed tolerance loop, it is necessary that the pump-purge manifold or a portion of the modular/monolithic gas handling system manifold to which it is attached be sufficiently free floating to permit making of all necessary connections without creating stress within such connections which can lead to an increased rate of corrosion or failure of the connection.

In a preferred embodiment gas handling system, preferably the gas handling flow lines which make up the system are comprised of individual sticks of gas handling elements, each of which is attached to the manifold of the pump-purge system so that they are free floating.

When it is desired to confine the gas handling system to minimal dimensions, and the pump-purge manifold is such that the spacing between valves mounted on the monolithic manifold is minimal, the preferred configuration for at least a portion of the fluid flow conduits within the pump-purge manifold is a "V" shaped configuration.

BRIEF DESCRIPTION OF THE DRAWINGS

FIG. 1A shows a top view schematic of a gas handling system mounted on a pallet. This gas handling system is of the kind generally used in the semiconductor industry and is available from Applied Materials, Inc. of Santa Clara, Calif. The gas handling system includes three inert gas flow lines (sticks) shown on the left side of FIG. 1A, three corrosive gas flow sticks shown on the right side of FIG. 1A, and a pump-purge line in the center between the inert gas sticks and the corrosive gas sticks.

FIG. 1B shows a side view schematic of a hazardous gas stick.

FIG. 1C shows a side view schematic of an inert gas stick.

FIG. 2C-2 shows a three-dimensional view of a non-regulated inert gas stick.

FIG. 2C-3 shows a three-dimensional view of a regulated inert gas stick.

FIG. 2B-2 shows a three-dimensional view of a non-regulated hazardous gas stick.

FIG. 2B-3 shows a three-dimensional view of a regulated hazardous gas stick.

FIG. 3 shows a three-dimensional view of the modular/monolithic gas handling system shown in FIG. 2A, with the pump purge system shown at the left hand side of FIG. 3.

FIG. 10 is a cross-sectional view of the pump-purge manifold shown in FIG. 7 at B—B. In particular, this cross-sectional view shows the relationship between the internal conduits into which purge gas may flow.

DETAILED DESCRIPTION OF THE PREFERRED EMBODIMENTS

Figure 2C:
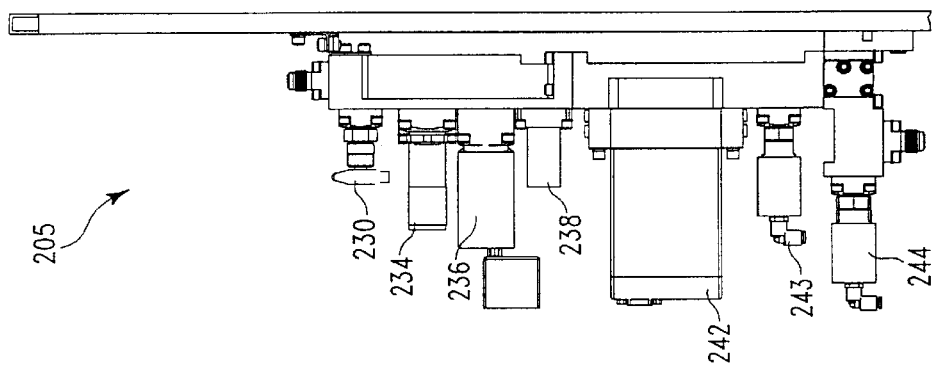
FIG. 2C shows a side view schematic of an inert gas stick attached to a portion of the pump-purge manifold.

The present disclosure pertains to a pump-purge system which can be integrated into a modular/monolithic gas handling system without creating a closed tolerance loop. In particular, the pump purge system comprises at least one dual port valve, or a combination of valves attached to a modular manifold, which can be mounted upon a modular/monolithic gas handling system. The dual port valve(s) or other combination of valves work in combination with conduits machined within the interior of the modular manifold to enable application of a vacuum (pumping) or for transfer of flush gas within a modular/monolithic gas handling system attached to the pump-purge system. To avoid the formation of a closed tolerance loop, it is necessary that the pump-purge manifold or a portion of the modular/monolithic gas block to which it is attached be sufficiently free floating to permit making of all necessary connections without creating significant stress within such connections.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, a modular/monolithic gas handling system may be capable of handling one gas or several gases and may comprise one module or several modules combined in a cluster.

Specific terminology of particular importance to the description of the present invention is defined below.

The term "closed-tolerance loop" refers to the plumbing used to form a complete gas flow path within a combination of gas handling elements. If at least one series of elements through which a fluid is to flow are interconnected such that a fluid flowing through the conduits between the elements can return to its starting point, this is called a "loop". If at least three of gas handling elements are present within the loop and these three elements are fixed in position relative to each other, the result is a closed-tolerance loop, i.e. there is a limited tolerance for the position of the plumbing relative to the gas handling elements and if this tolerance is exceeded, this results in stress within the fluid transfer conduit or at the connection point of the conduit to the gas handling element.

The term "fluid handling system" refers to a fluid processing system of the kind typically used in the chemical processing industry where fluids are transported through pressure reduction equipment, or filters, or a mass flow controller, or mixing equipment, and combinations thereof, for example.

The term "gas handling system" refers to a fluid processing system where the fluid is a gas.

The term "modular" refers a component or combination of components which make up a unitary structure, where the unitary structure is designed to be arranged or joined to other unitary structures in a variety of ways to create a desired system. In the present instance preferred embodiment, a modular gas handling system is one made up of a combination of gas handling elements supplied as unitary structures which can be arranged and attached together to form the desired gas processing and handling system. A modular gas handling system typically includes a series of gas handling elements, and at least one manifold which enables the interconnection of two or more gas handling elements.

The term "monolithic" refers to something made from a single block of material.

In the present instance, a monolithic fluid handling system refers to a system comprising one or more fluid handling modules where the module includes a monolithic conduit containing structure for transport of fluid between fluid handling elements within the module. In the present instance preferred embodiment, a modular/monolithic gas handling system includes a modular gas handling system where the manifold which enables the interconnection of two or more gas handling elements comprises at least one block of material having a plurality of interior conduits which transport gas from one gas handling element to another within the module.

The term "pump-purge" component refers to a component of a system used to remove residual fluid from at least one fluid handling element of a fluid handling system. In particular, the system enables a pumping out of residual fluid, and or the purging out of residual fluid by flowing a flush fluid through the fluid handling element. In the present instance preferred embodiment, a pump-purge component in the form of a combination of gas handling elements and a monolithic manifold enables the removal of residual gases from a modular/monolithic gas handling system.

II. Description of a Gas Handling System of the Kind With Which the Pump-Purge System of the Present Invention Can be Used As a means of introducing the gas handling system in general, FIGS. 1A–1C show a typical prior art pallet comprising gas handling equipment of the kind used to supply processed gases to a variety of reactor chambers during the processing of semiconductor substrates. FIG. 1A is a top view of the pallet 100, including a bank 102 of three hazardous gas sticks 103 and a bank 104 of three non-hazardous gas sticks 105. The hazardous gas sticks 103 require pump-purge capability. A vacuum pump (not shown) is applied to a hazardous gas stick 103 to evacuate the hazardous gas and an inert gas such as nitrogen or argon is pressured into the line to purge any remaining hazardous gas. This pump-purge process may be repeated several times if necessary to provide for complete removal of a hazardous gas. The pump-purge process is enabled by a pump purge system 106 which provides for the removal of hazardous gases from gas sticks 103 at the end of the gas flow path, at 107a, and which enables the addition of purge gas at double headed valves 112 near the beginning of the flow path, at 107b.

A quick look at FIG. 1A shows the extent of the plumbing/pipe fitting necessary to maintain the pallet 100. For Example there are a very large number of VCR fittings, some of which are labeled 108. The VCR fittings are welded fittings, and each time one of these fittings has to be opened, there is considerable down time. In addition, the welding creates a corrosion site at the heat affected zone on each side of the valve. There is also a large amount of tubing (piping), some of which is labeled 109, in FIG. 1. Each time an element of the gas handling system has to be changed out, there is a considerable amount of time required for replumbing of tubing and replacement of VCR fittings.

FIG. 1B is a side view schematic of one of the hazardous gas sticks 103. A typical hazardous gas stick comprises a manual diaphragm valve 110, a double headed valve 112, a regulator 114, a pressure transducer 116, a filter 118, a pneumatic valve 120, a mass flow controller 122, and the pump-purge system pneumatic valve 124. Due to the corrosive environment present with many of the hazardous gases, the regulators 114 and mass flow controllers 122 break down and need replacement. In addition, it is often necessary to change out filter 118. As a result, the maintenance work and down time for a hazardous gas stick 103 is extensive.

FIG. 1C is a side view schematic of one of the non-hazardous gas sticks 105. A typical non-hazardous gas stick comprises a manual diaphragm valve 130, a regulator 114, a pressure transducer 113, a filter 138, a pneumatic valve 140, a mass flow controller 142, and the pump-purge system pneumatic valve 144. The non-hazardous gas sticks 105 do not require purging and therefore do not require a double-headed valve which permits either the process gas or a purge gas to be fed into the same line. However, the non-hazardous gas lines do need to be pumped out periodically, to remove moisture which gets trapped in these lines.

Figure 2A:
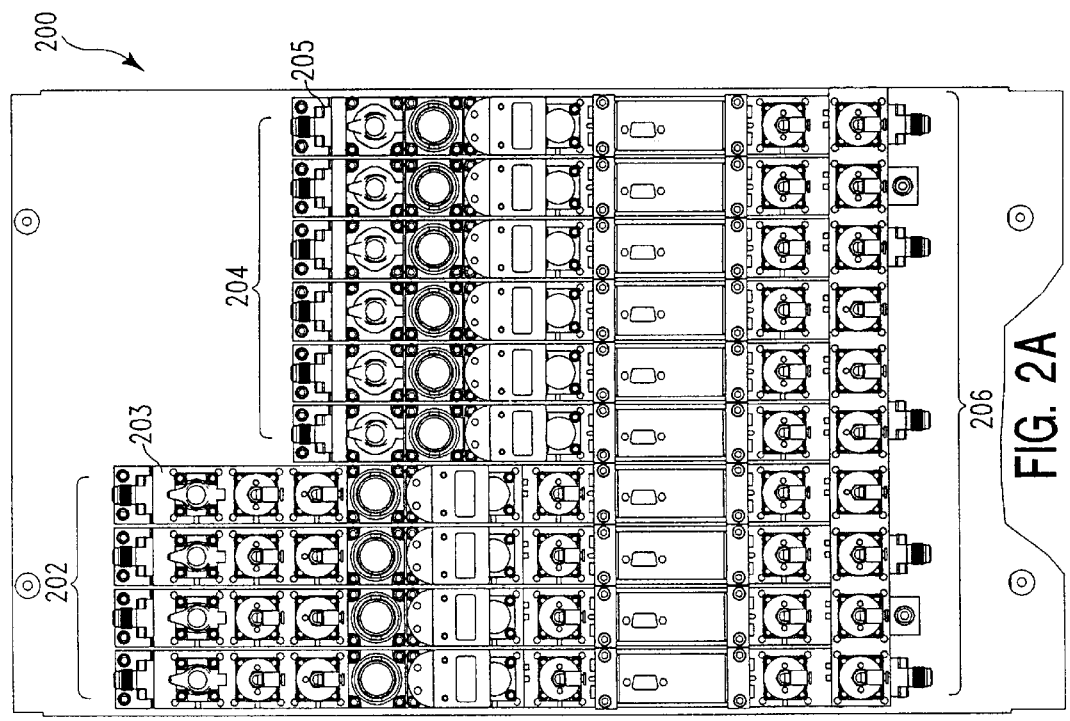
FIG. 2A shows a top view schematic of a modular/monolithic gas handling system of the kind which can be used to replace the gas handling system shown in FIG. 1A. The FIG. 2A gas handling system includes four hazardous gas sticks on the left side of FIG. 2A, and six inert gas sticks on the right side of FIG. 2A. The pump-purge capability is shown as a single row of pneumatic valves overlying a monolithic block (which contains gas flow channels which are not shown).
Figure 2B:
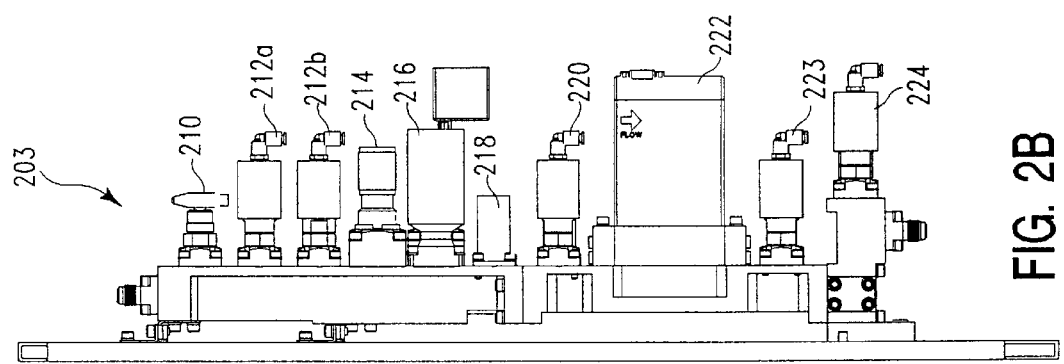
FIG. 2B shows a side view schematic of a hazardous gas stick attached to a portion of the pump-purge manifold.

FIGS. 2A–2C shows a preferred embodiment pallet comprising gas handling equipment which can be used to supply processed gases to a variety of reactor chambers during the processing of semiconductor substrates. FIG. 2A is a top view of the pallet 200, including a bank 202 of four hazardous gas sticks 203 and a bank 204 of six non-hazardous gas sticks 205. The hazardous gas sticks 203 require pump-purge capability. A vacuum pump (not shown) is applied to a hazardous gas stick 203 to evacuate the hazardous gas and an inert gas such as nitrogen or argon is pressured into the line to purge any remaining hazardous gas, as previously described. This pump-purge process may be repeated several times if necessary to provide for complete removal of a hazardous gas. The pump-purge process is enabled by a pump-purge system 206 which will be described in detail subsequently herein. A quick look at FIG. 2A shows that only a minor amount of plumbing/pipe fitting necessary to maintain the pallet 200. For example, as is apparent from FIGS. 2B and 2C, each gas handling element is attached to the gas handling system by merely bolting the element to the upper surface of a monolithic block (which contains conduits, of the kind shown in FIGS. 5 and 6) through which the gases travel. To be able to replace a gas handling element, one simply goes through the pump-purge cycles necessary to remove any hazardous gas from the area surrounding the gas handling element, unbolts the element, replaces the seal between the element and the monolithic block containing the fluid (gas) flow conduits, if necessary, and bolts a new gas handling element in place.

FIG. 2B is a side view schematic of one of the hazardous gas sticks 203, attached to a portion of the pump-purge manifold 206. A typical hazardous gas stick comprises a manual diaphragm valve 210, a set of pneumatic valves 212a and 212b for handling the pump-purge functions, a regulator 214, a pressure transducer 216, a filter 218, a pneumatic valve 220, a mass flow controller 222, and pneumatic valve 223. Attached to the hazardous gas stick 203 is a pump-purge system pneumatic valve 224.

FIG. 2C is a side view schematic of one of the non-hazardous gas sticks 205. A typical non-hazardous gas stick comprises a manual diaphragm valve 230, a regulator 234, a pressure transducer 236, a filter 238, a mass flow controller 242, and pneumatic valve 243. Attached to the non-hazardous gas stick 205 is a pump-purge system pneumatic valve 244.

The hazardous and non-hazardous gas sticks used in the modular/monolithic gas handling system can vary depending on the needs of the particular processing application. Some alternative gas handling sticks are shown in FIGS. 2-B-2, 2-B-3, 2C-2, and 2-C-3.

Figures 2, 2B:
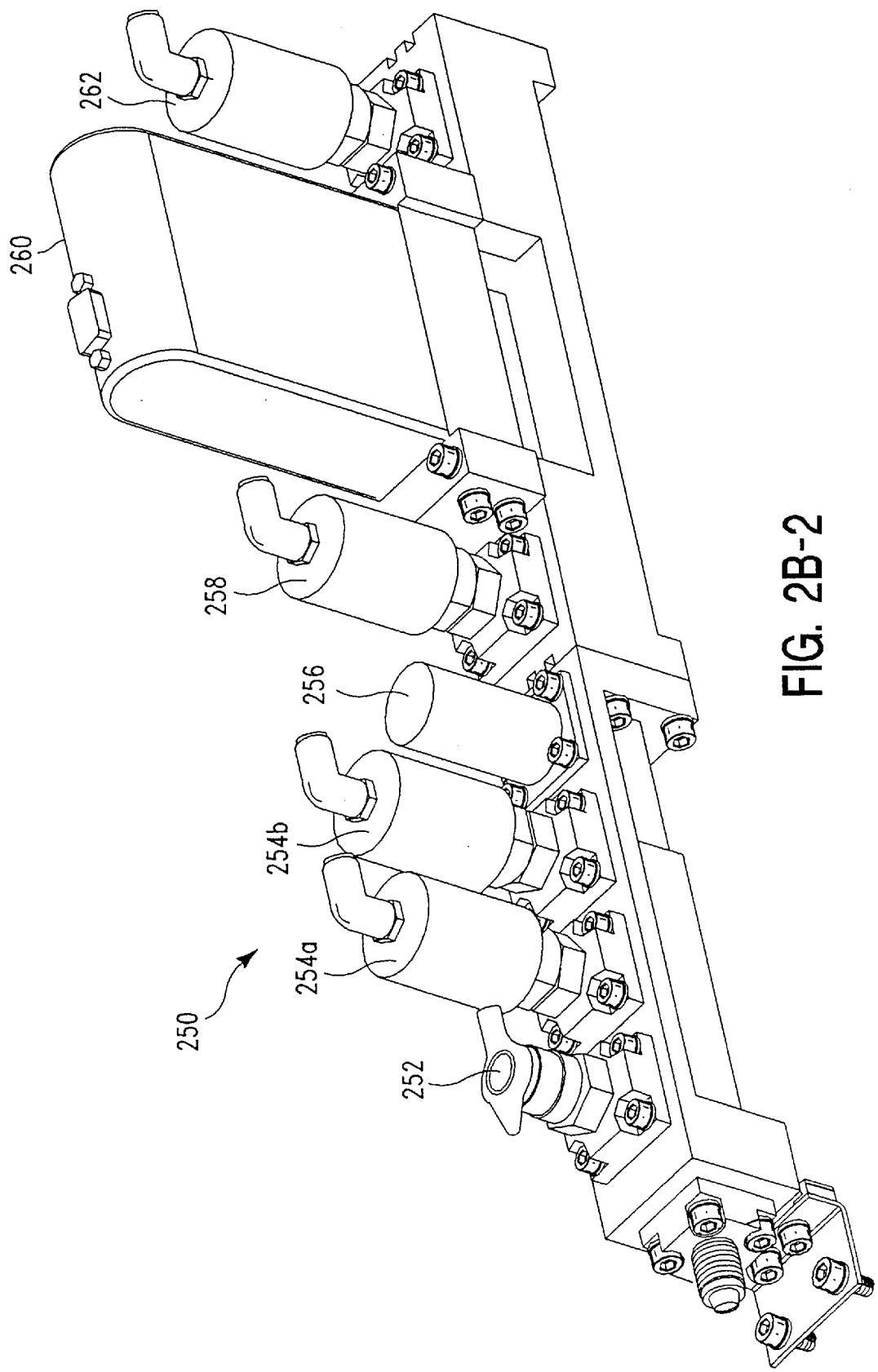

FIG. 2-B-2 shows a three dimensional view of a non-regulated hazardous gas handling stick 250, including a manual diaphragm valve 252, a set of pneumatic valves 254a and 254b for handling the pump-purge functions, a filter 256, a pneumatic valve 258, a mass flow controller 260, and a pneumatic valve 262. This hazardous gas handling stick is shown unattached to a pump-purge system.

FIG. 2-B-3 shows a three dimensional view of a regulated hazardous gas handling stick 270, including a manual diaphragm valve 272, a set of pneumatic valves 274a and 274b for handling the pump-purge functions, a regulator 276, a pressure transducer 278, a filter 280, a pneumatic valve 282, a mass flow controller 284, and a pneumatic valve 286. This hazardous gas handling stick is shown unattached to a pump-purge system.

FIG. 2-C-2 shows a three dimensional view of a non-regulated non-hazardous gas handling stick 288, including a manual diaphragm valve 289, a filter 290, a mass flow controller 291, and a pneumatic valve 292. This non-hazardous gas handling stick is shown unattached to a pump-purge system.

FIG. 2-C-3 shows a three dimensional view of a regulated non-hazardous gas handling stick 293, including a manual diaphragm valve 294, a regulator 295, a pressure transducer 296, a filter 297, a mass flow controller 298, and a pneumatic valve 299. This non-hazardous gas handling stick is shown unattached to a pump-purge system.

Figures 2, 2B, 3:
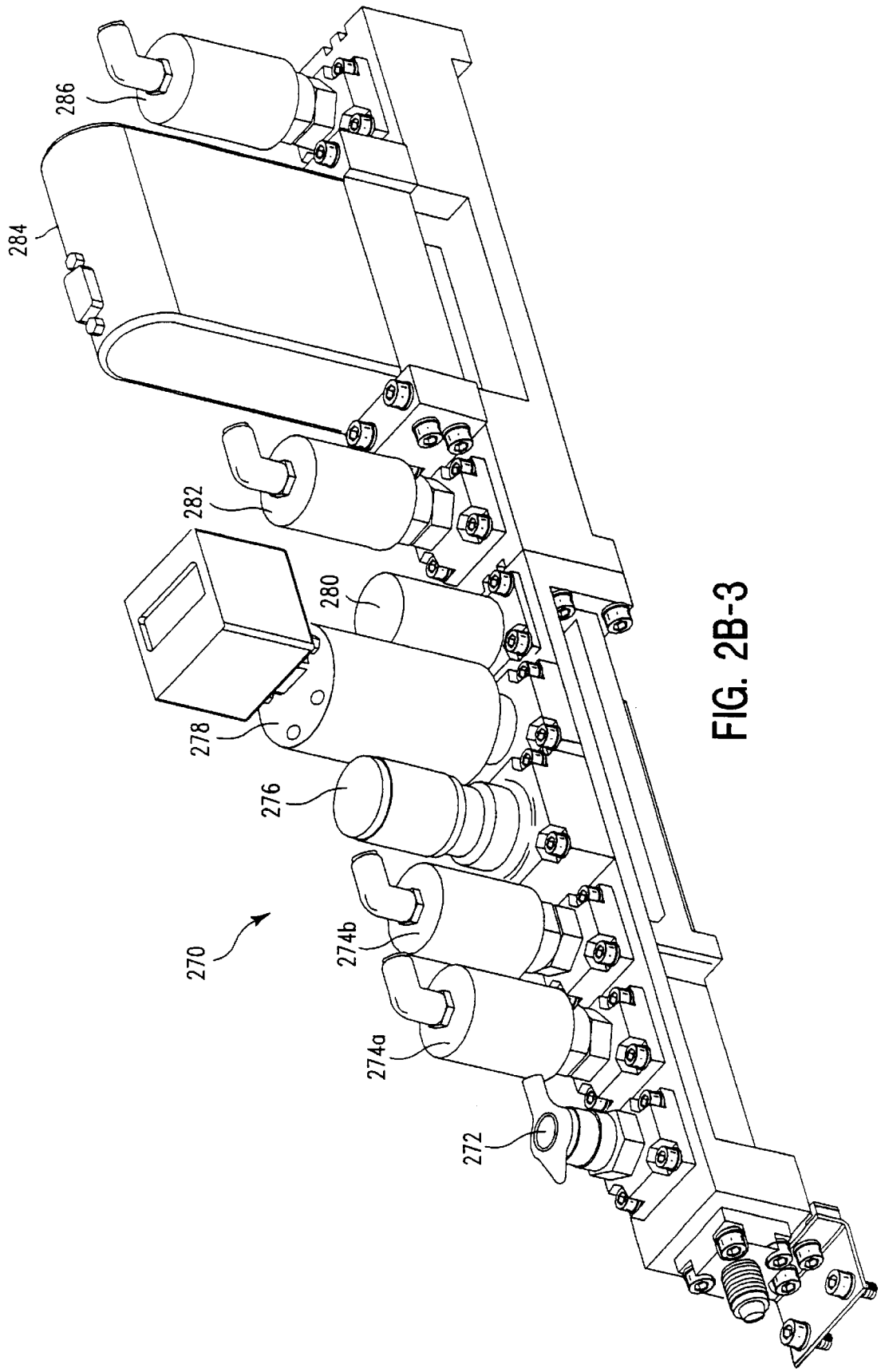
Figures 2, 2C:
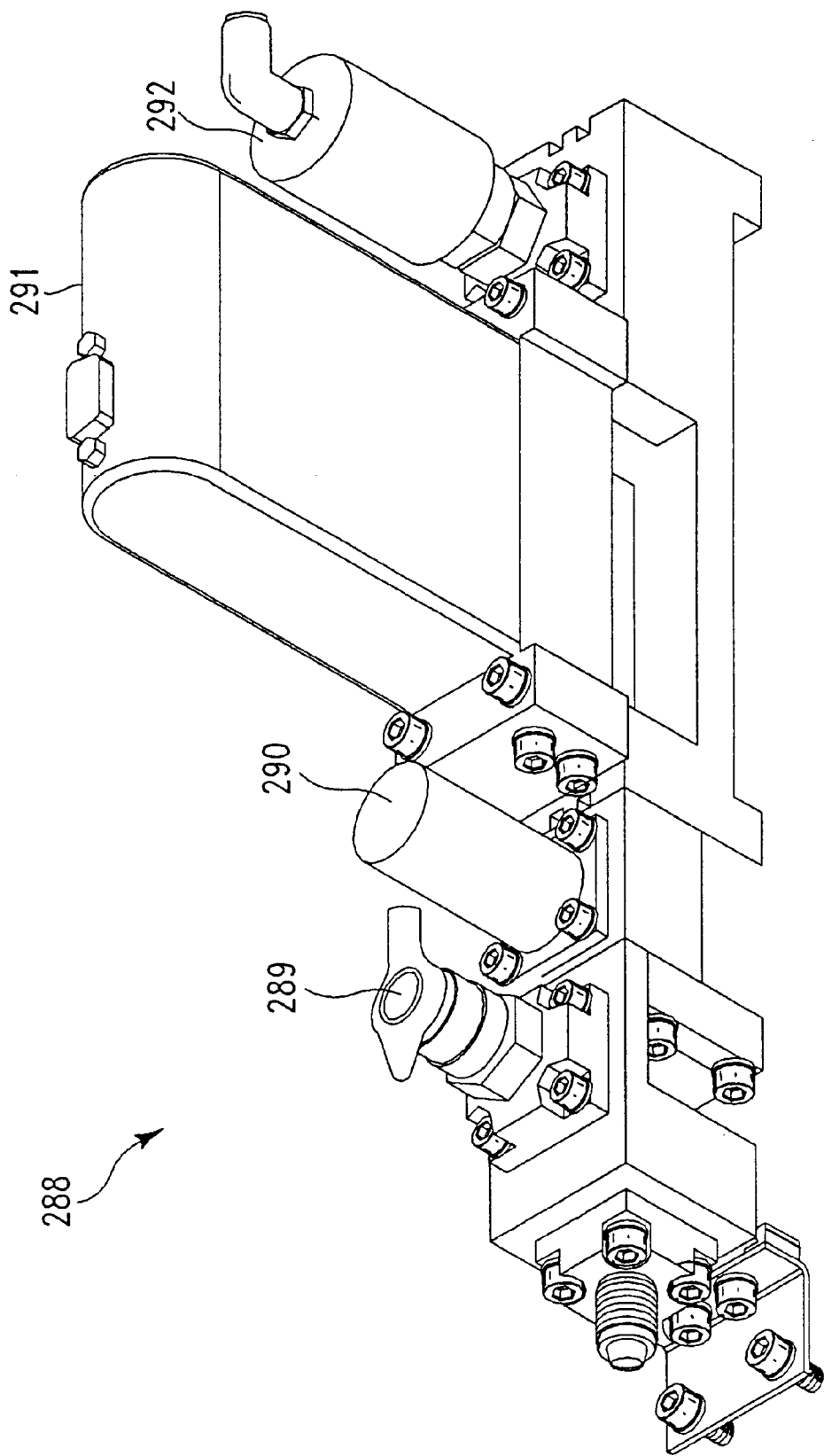
Figures 2, 2C, 3:
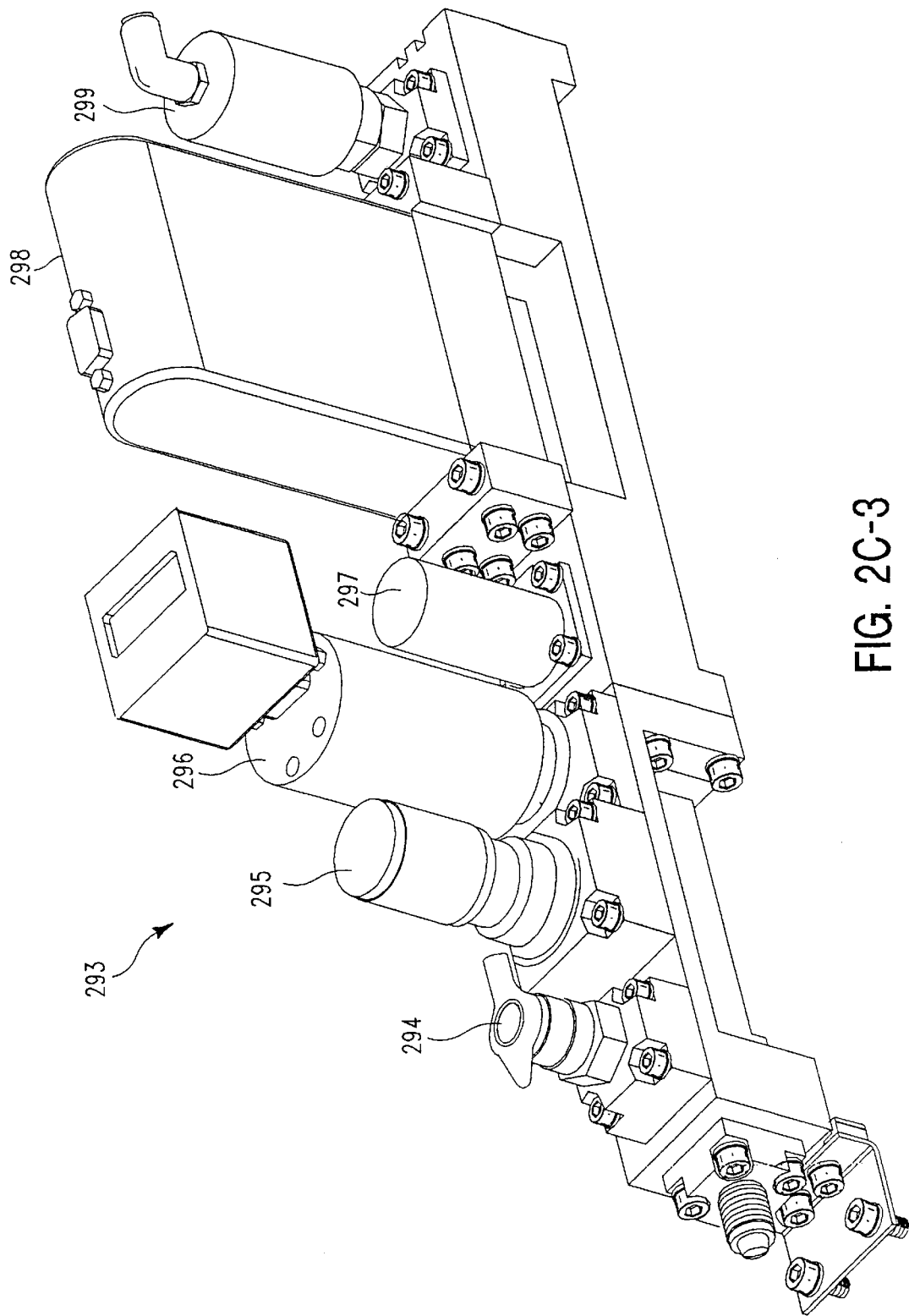
Figure 3:
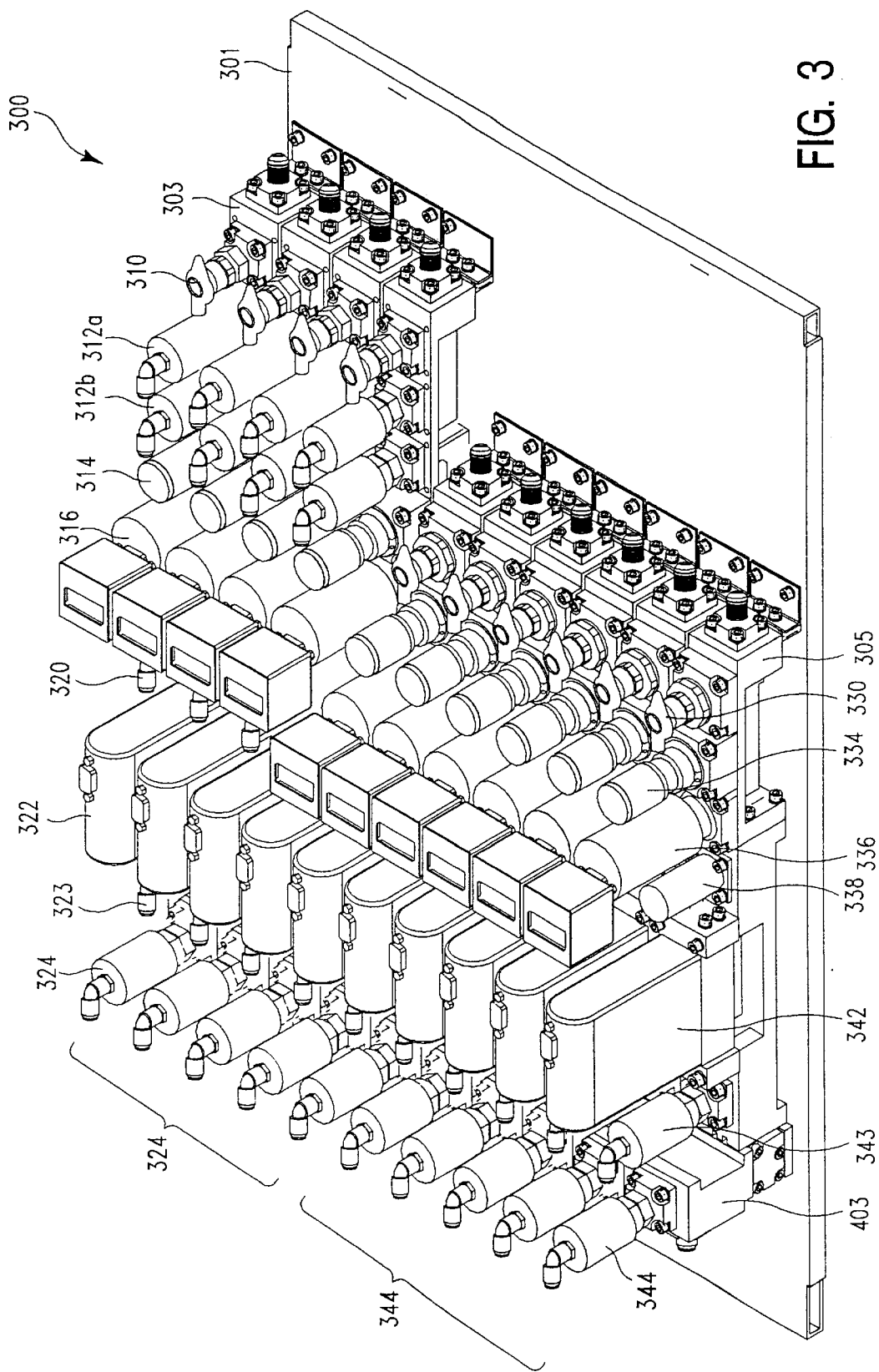

FIG. 3 shows a three dimensional view of a gas handling system 300 mounted on a pallet 301, where the gas handling system includes for sticks 303 for handling hazardous gases and 6 sticks 305 for handling non-hazardous gases. A hazardous gas sticks 303 includes a manual diaphragm valve 303, a set of pneumatic valves 312a and 312b for handling the pump-purge functions, a regulator 314, a pressure transducer 316, a filter which is hidden from view, a pneumatic valve 320, a mass flow controller 322, and a pneumatic valve 323. The hazardous gas stick 303 is attached to the pump-purge system, which provides pneumatic valve 324. A non-hazardous gas stick 205 includes a manual diaphragm valve 330, a regulator 334, a pressure transducer 336, a filter 338 a mass flow controller 342, and a pneumatic valve 343. The non-hazardous gas stick 205 is attached to the pump-purge system, which provides pneumatic valve 344.

Figure 4:
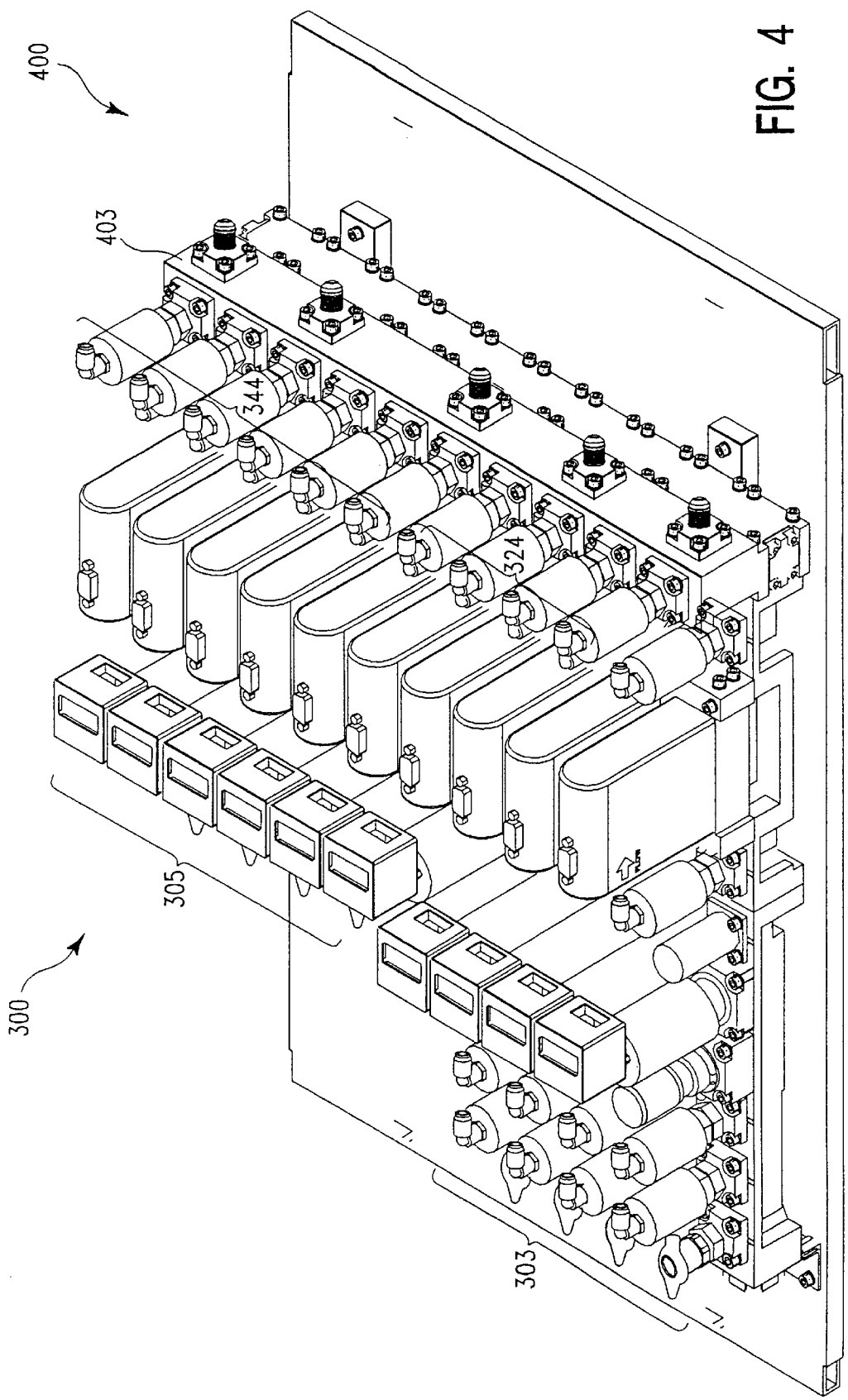
FIG. 4 shows a three-dimensional view of the modular/monolithic gas handling system shown in FIG. 3, with the pump purge system shown in more detail at the right hand side of FIG. 4.

FIG. 4 shows the gas handling system 300 from a view which emphasizes the pump-purge valve and manifold system 400. In particular, the pump-purge pneumatic valves 324 for the four hazardous gas sticks 303 and the pump-purge pneumatic valves 344 for the six non-hazardous sticks 305 are shown in more detail. Also shown is the pump-purge monolithic manifold 403 which is described specifically with reference to FIG. 6 subsequently herein.

Figure 5A:
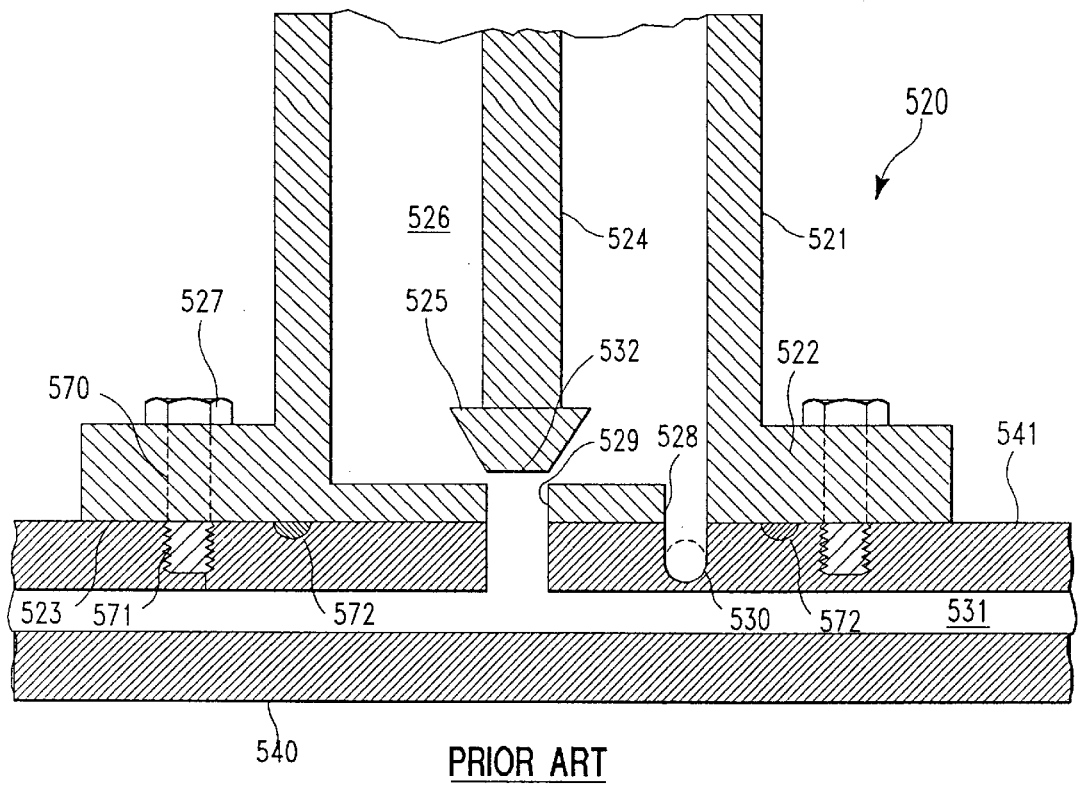
FIG. 5A shows a cross-sectional view of a flat bottom valve of the kind which can be used in a modular/monolithic gas handling system. The valve is shown mounted over a monolithic fluid handling system which includes various conduits for transport of fluid between fluid handling elements within the gas handling system.

For purposes of making clear how the individual gas handling elements are attached to and work with a monolithic fluid handling system (in the preferred embodiment a gas handling system), a typical gas handling element comprising a flat bottom valve sealed against a monolithic fluid handling system is described with reference to FIGS. 5A and 5B. The structure shown in FIG. 5A is prior art and is described in detail in U.S. patent application Ser. No. 08/564,466, assigned to the assignee of the present application, and previously referenced in the Background Art section of this application.

FIG. 5A shows a cross sectional view of a valve body assembly 520 attached to a monolithic manifold 540 having a flat outside surface 541. Manifold 540 includes a fluid passage 531 and inlet and outlet passages 528 and 529, respectively. Manifold inlet passage 528 aligns with a through opening 530 extending at least partially through the width of manifold 540 to direct a fluid flow into the manifold. Manifold 540 also possesses an opening 532 for directing a fluid flow out of valve assembly cavity 526 into passage 529. As illustrated, assembly 520 includes a valve element 525 attached to a stem 524 to forcibly engage the valve element against manifold outlet opening 532. Note that the manifold 540 also comprises threaded openings 571 disposed along flat outside surface 541. The valve body assembly 520 and manifold 540 are attached by threaded fasteners 527. A sealing device 572 which is disposed between the valve body assembly and manifold to seal the interface between the two parts.

Figure 5B:
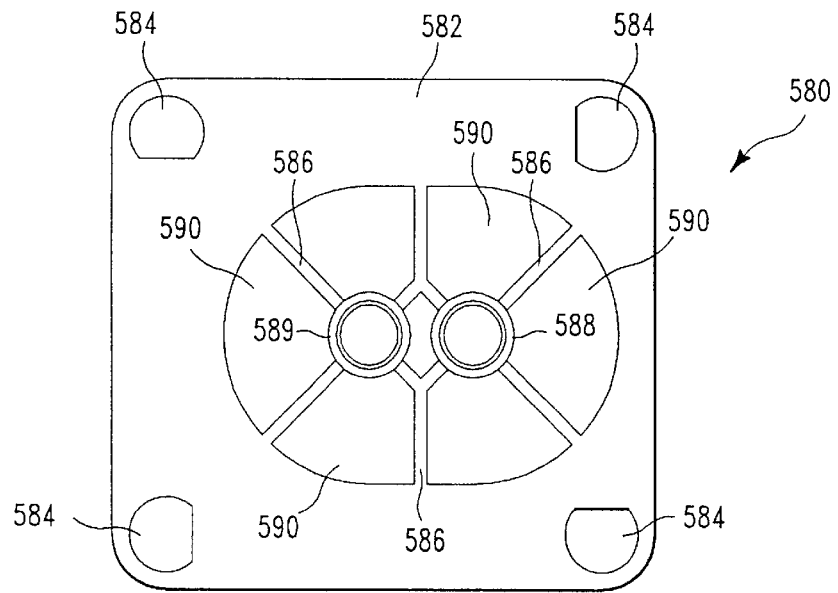
FIG. 5B shows a top view of one kind of seal which can be used between the flat bottom valve and a monolithic manifold or fluid handling system.

An alternative to sealing device 572 is shown in FIG. 5B, which shows a "C" seal 580, which provides for individual isolation of inlet passage 528 from outlet passage 529. In particular, a "C" seal is typically comprised of a mounting flange 582 which is generally a very thin metal sheet having mounting openings 584 disposed at the periphery thereof and interior fingers 586 for holding metal seals 588 and 589 for inlet passage 528 and outlet passage 529, respectively. The metal seals 588 and 589 are held in position by fingers 586 which are surrounded by openings 590 so that the seals are flexible with regard to positioning and can be lined up inlet and outlet passages 528 and 529, respectively. The facing between metal seals of the kind shown in FIG. 5B and a monolithic manifold is readily apparent in view of FIGS. 7 and 8 which will be discussed in detail subsequently.

III. Description of the Preferred Embodiment of the Pump-Purge Apparatus

Figure 6:
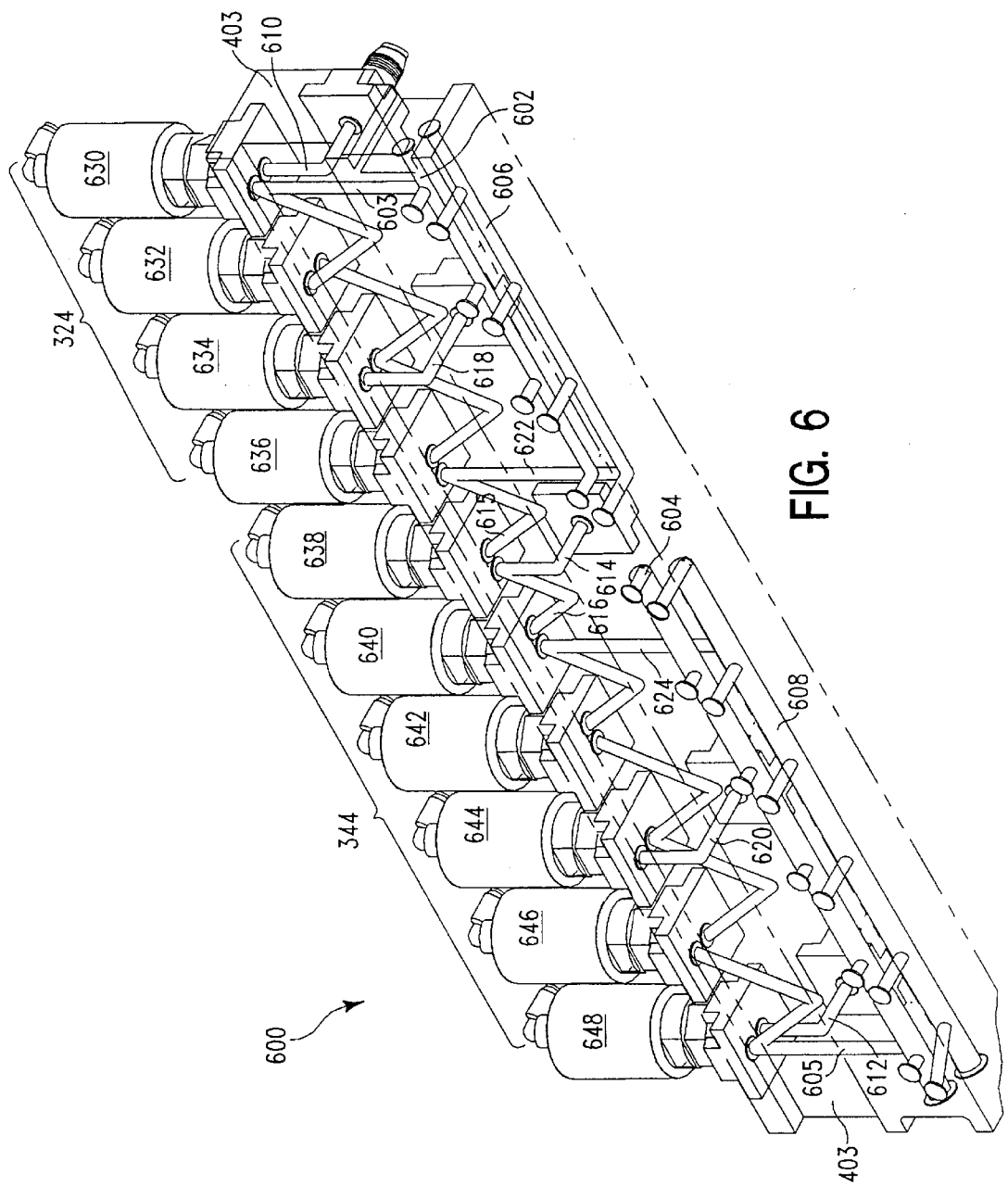
FIG. 6 shows a three dimensional view of the pump-purge system, and particularly the interior of the manifold block, illustrating the gas handling conduits within the manifold block of the pump purge system. In this particular embodiment, there is a dual pumping system so that the hazardous gases are pumped through a first line while the inert gases are pumped through a second line.

FIG. 6 illustrates the pump-purge valving system and manifold 600 which enables the integration of the critical pump-purge function into the gas handling sticks. FIG. 6 illustrates one preferred embodiment design and one skilled in the art may use the concepts taught here to design different flow paths than those shown in FIG. 6 to accomplish the same purpose.

With reference to FIG. 1, in the past, the pump-purge system was mounted on the gas handling system pallet, but was connected to the individual hazardous gas handling sticks by plumbing conduits 107a and 107b. We have added pump-purge fluid transfer conduits to the monolithic manifolds which connect the elements of the hazardous gas handling stick. We have then designed a pump-purge manifold and valving system which can be attached as a module to one end of the gas handling sticks, to enable the pump-purge function within the entire bank of hazardous and non-hazardous gas handling sticks.

In particular, with reference to the preferred embodiment shown in FIG. 6, valves 630 to 636 within bank 324 service the hazardous process gas sticks. Valves 640 to 648 within bank 344 service the non-hazardous process gas sticks. Valve 638 shown within bank 344 services both the hazardous process gas sticks and the non-hazardous process gas sticks. All of the valves are flat bottom valves which work in combination with monolithic gas handling manifold 403 which contains the fluid flow channels necessary to enable the pump-purge function.

With regard to the hazardous gas sticks, fluid flow conduit 602 receives gases from the hazardous gas sticks through rising gas channel 603 to valve 630 which may permit its exit from conduit 610 to a pumping system (not shown) for evacuation of the hazardous process gases. Pneumatic valves at the end of each hazardous process gas stick, shown in FIG. 2B as 223 may be used to control precisely which hazardous process gas is allowed to enter fluid flow conduit 602. Inert gas used for purging the hazardous gas sticks (and potentially the non-hazardous gas sticks as well) enters monolithic manifold 403 through conduit 614. If valve 638 is open, the inert purge gas will pass through line 615 to valve 636. If valve 636 is closed, the purge gas then travels through lowering gas channel 622 to enter conduit 606 which feeds the hazardous gas sticks. If valve 638 is closed, the inert gas will flow through line 616 to valve 640. If valve 640 is open and valve 642 is closed, inert gas will flow through lowering gas channel 624 to enter conduit 608 which feeds the non-hazardous gas sticks. When purging the hazardous gas sticks, from conduit 606 the inert purge gas passes into fluid flow conduits (not shown) leading to individual hazardous gas sticks. The location of entry of the purge gas into an individual hazardous gas stick may depend on which gas handling elements it is desired to purge. In the preferred embodiment of the invention shown in FIG. 2B, the purge gas enters the conduits at valve 212b. The purge gas then flows through the hazardous gas processing elements toward pump-purge element 224, where it enters conduit 602, travels up rising gas channel 603, travels through valve 632 (since valve 630 is closed) and to valve 634, which is open, enabling the purge gas to exit through conduit 618.

With regard to the non-hazardous gas sticks, fluid flow conduit 604 receives gases from the non-hazardous gas sticks through rising gas channel 605 to valve 648 which may permit its exit from conduit 612 to a pumping system (not shown) for evacuation of the non-hazardous process gases. Pneumatic valves at the end of each non-hazardous process gas stick, shown in FIG. 2C as 243 may be used to control precisely which non-hazardous process gas is allowed to enter fluid flow conduit 604.

Generally the non-hazardous gas sticks are not purged, but are evacuation pumped only. However, as previously described, inert gas may be used to purge the non-hazardous gas sticks if desired. The location of entry of the purge gas into an individual non-hazardous gas stick would depend on which gas handling elements it is desired to purge. In the preferred embodiment of the invention shown in FIG. 2C, the non-hazardous gas sticks are not purged.

The important concept here is not which gas is flowing in which direction, but the use of a modular/monolithic pump-purge gas valving and manifold system to provide for the pump-purge function, when used in conjunction with a modular/monolithic gas handling system. Further, the design of the preferred embodiment illustrated in FIGS. 2A–2C and in FIG. 6 provides a combined structure where each stick is attached individually to the modular/monolithic pump-purge gas valving and manifold system, thus ensuring that there is no closed tolerance loop. Attachment of any individual gas handling stick to the pump-purge manifold is easily accomplished, as the following description will reveal, with no risk of creating stress at the attachment point which can lead to corrosion at that location. This is in stark contrast with previous pump-purge systems of the kind illustrated in FIG. 1A, which enabled the creation of a closed tolerance loop, leading to stressed attachment points, with accompanying risk of accelerated corrosion.

Figure 7:
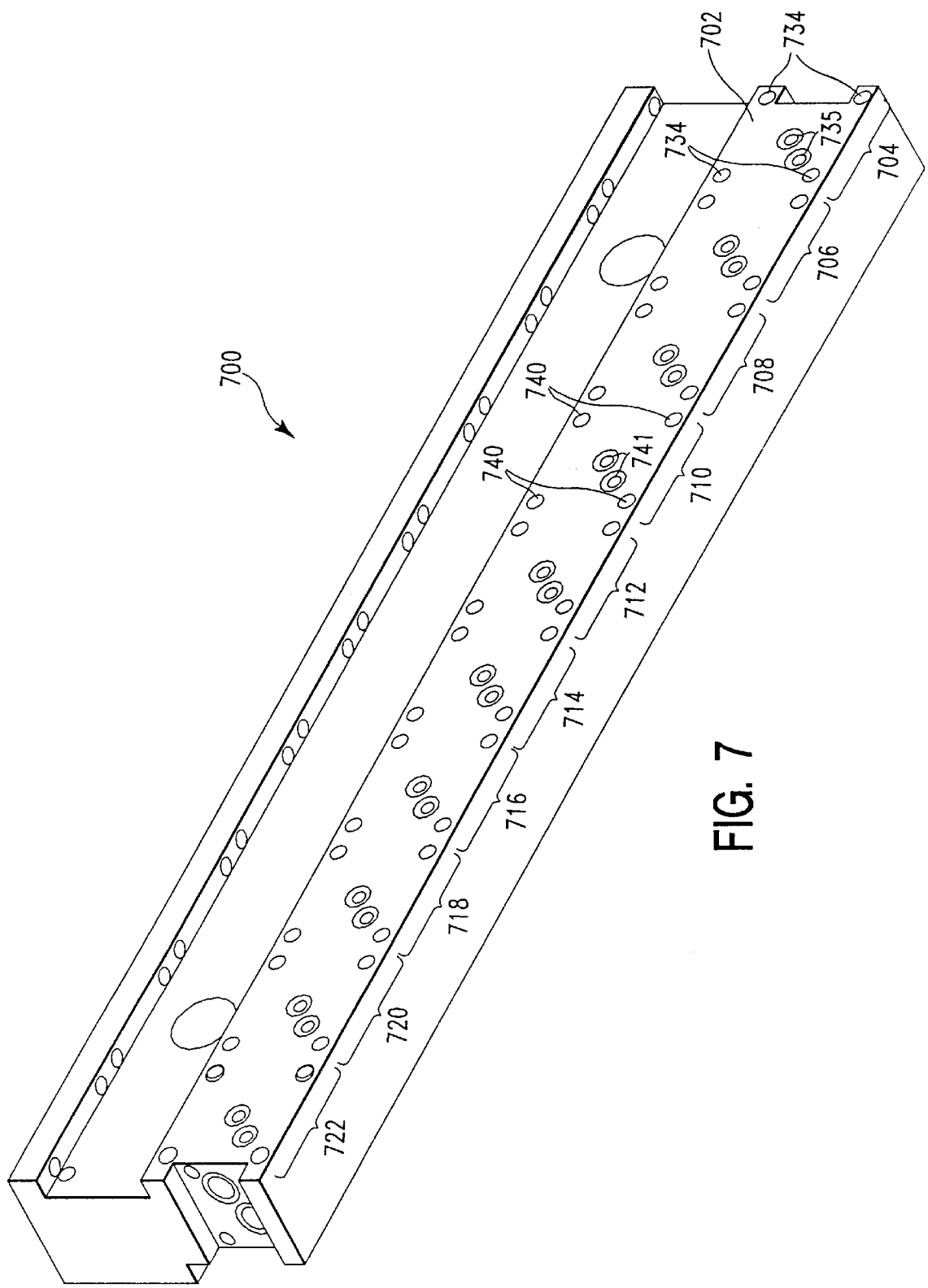
FIG. 7 shows a three-dimensional view of the pump purge system manifold block, exterior view, showing the face of manifold block which attaches to the gas sticks.

With regard to the integrated pump-purge valving and manifold system which is the main focus of the present invention, FIG. 7 shows a three dimensional view of the exterior of the modular/monolithic pump-purge manifold 700. The front face 702 is the entry face of the manifold which is attached to the modular/monolithic gas handling system sticks. The attachment locations for each stick are identified, beginning with the number 704 and ending with the number 722, 10 attachment sites in all. An individual gas handling stick is simply bolted to the surface at four points, identified as 734 with respect to location 704 and as 740 with respect to location 710, for example. Each of the attachment points is a drilled, threaded opening in the front face 702 of monolithic manifold 700. A "C" seal of the kind discussed with reference to FIG. 5 is used to provide the seal between the individual gas handling stick ant the face 702 of monolithic manifold 700. The "C" seal is simply bolted down through openings 584 shown in FIG. 5, with the metal sealing rings, 588 and 589 setting in recesses in the monolithic manifold face 702. The recesses are numbered 735 with reference to position 704, and 741 with reference to position 710, for example.

Figure 8:
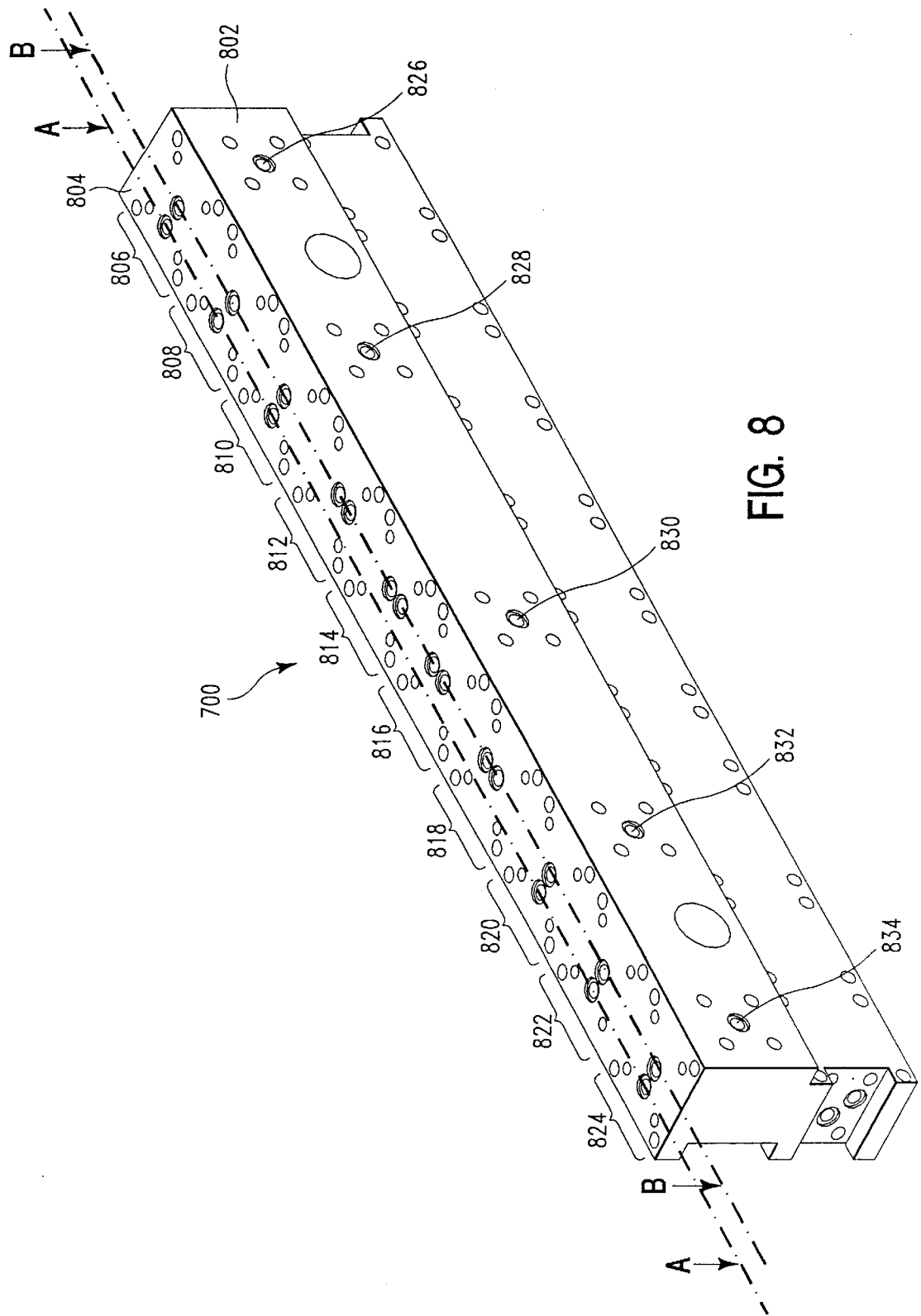
FIG. 8 shows a three-dimensional view of the pump-purge system manifold block, exterior view, showing the face of the manifold block which attaches to the evacuation pumping systems.
Figure 9:
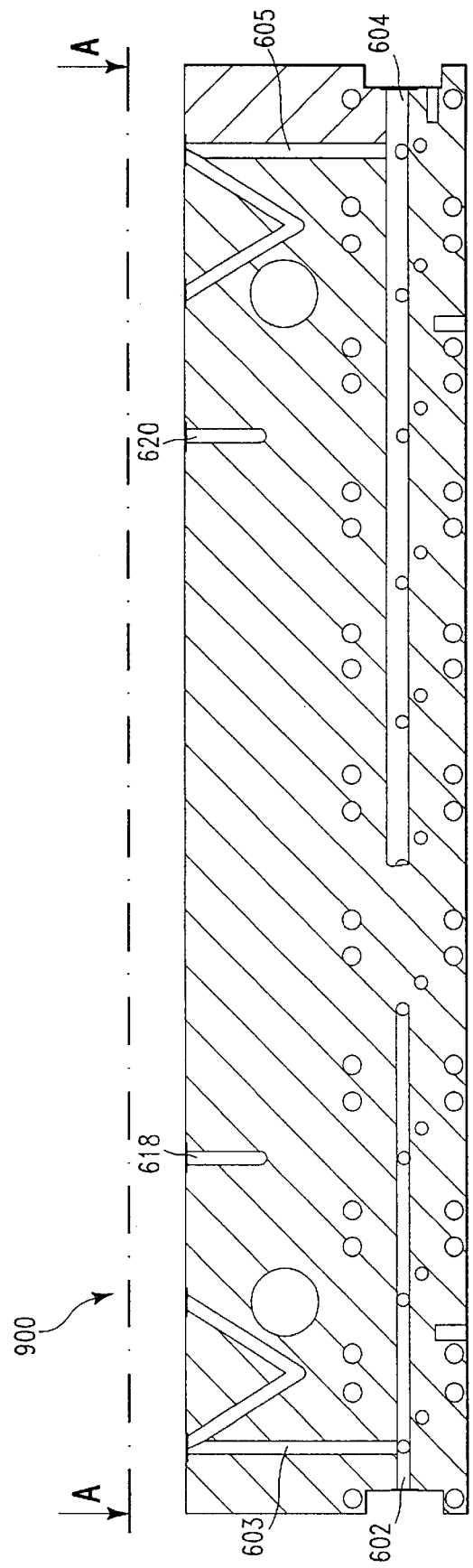
FIG. 9 is a cross-sectional view of the pump-purge manifold shown in FIG. 7 at A—A. In particular, this cross-sectional view shows the relationship between the internal conduits into which process gases (hazardous and inert) flow.

FIG. 8 shows a three dimensional view of the exterior of the modular/monolithic pump-purge manifold 700 from the back face 802. The back face 802 is the exit from the manifold which is attached to various pumping systems which handle the supply and removal of gasses to and from the manifold. For example, opening 826 is from the mass flow controller for non-hazardous gases (not shown) and is attached to conduits (not shown) leading to the semiconductor processing chamber (not shown). Opening 828 is attached to conduits (not shown) leading to a pump for pumping out the non-hazardous gas sticks (not shown). Opening 830 is the opening into which an inert gas such as nitrogen enters the pump-purge manifold back face 802. Opening 832 is attached to conduits (not shown) leading to a pump for pumping out the hazardous gas sticks (not shown). Opening 834 is from the mass flow controller for hazardous gases (not shown) and is attached (not shown) to conduits leading to the semiconductor processing chamber (not shown). Upper face 804 of modular/monolithic pump-purge manifold 700 is attached to the valving system shown and described with reference to FIG. 6. Again, a valve is attached at each location where a set of recessions for "C" seals is shown. The attachment location for each valve is identified, beginning with the number 806 and ending with the number 824, 10 attachment sites in all. An individual gas handling valve is simply bolted to the surface at four points, with "C" seal in place as described relative to attachment of the gas handling sticks. FIGS. 9 and 10 provide cross-sectional views within the pump-purge monolithic manifold, with FIG. 9 showing the cross-sectional view through the "A—A" location and FIG. 10 showing the cross-sectional view through the "B—B" location.

With reference to FIG. 9, cross-sectional view 900 at the "A—A" location shows the gas flow channels in the manifold interior which correspond with the process gas inlets to the manifold which are used by the pumping (evacuation) operation. Conduit 604 corresponds with the conduit of the same number in FIG. 6, and represents the fluid flow conduit which receives gases from the non-hazardous gas sticks. Rising gas channel 605 transfers the gas from conduit 604 to valve 648 (not shown) which may permit exit of the gas to a pumping system (not shown) for the evacuation of the non-hazardous process gases. Conduit 602 corresponds with the conduit of the same number in FIG. 6, and represents the fluid flow conduit which receives gases from the hazardous gas sticks. Rising gas channel 603 transfers the gas from conduit 602 to valve 630 (not shown on FIG. 9) which may permit exit of the gas to a pumping system (not shown) for the evacuation of the hazardous process gases. In addition, FIG. 9 shows purge gas mixture exit conduit 620 from which a purge mixture of inert gas and non-hazardous gas may exit pump purge manifold 700 and purge gas mixture exit conduit 618 from which a purge mixture of inert gas and hazardous gas may exit the manifold.

With reference to FIG. 10, cross-sectional view 1,000 at the "B—B" location shows the gas flow channels in the manifold interior which correspond with the purge operation. Conduit 608 corresponds with the conduit of the same number in FIG. 6, and represents the fluid flow conduit which receives inert gas which is used to purge non-hazardous gas sticks. Inert gas enters through conduit 614 and travels through valve 640 (not shown on FIG. 10) to lowering gas channel 624 which supplies conduit 608. From conduit 608, the inert gas travels to the selected entry position on the non-hazardous gas stick monolithic manifold. Conduit 606 corresponds with the conduit of the same number in FIG. 6, and represents the fluid flow conduit which receives inert gas which is used to purge hazardous gas sticks. Inert gas enters through conduit 614 and travels through valve 640 (not shown on FIG. 10) to lowering gas channel 624 which supplies conduit 608. From conduit 608, the inert gas travels to the selected entry position on the hazardous gas stick monolithic manifold. FIG. 10 also shows the exit conduit 612 for the pumping step from non-hazardous gas sticks and exit conduit 610 for the pumping step from hazardous gas sticks.

Of particular interest are "V" drilled conduits 1002 through 1008, which are a portion of the "V" drilled conduits used to transfer the gases between valves for purposes of enabling the close placement of the valves. With reference to both Figure 10 and FIG. 6, for example, "V" drilled conduit 1008 provides a fluid flow path between valve 646 and valve 644, "V" drilled conduit 1007 provides a fluid flow path between valve 642 and valve 644, and "V" drilled conduit 1006 provides a fluid flow path between valve 640 and valve 642. Due to the close proximity of the gas handling sticks on the pallet and the amount of space available within the monolithic pump-purge manifold, a "V" drilled conduit is the most practical means of providing the fluid flow path. This was determined using an empirical iterative process.

The angle "$\alpha$" at the base of the "V" is determined by the spacing between the valves, the diameter of the openings to the valves (or the diameter of the seal around those openings), and the diameter of the fluid flow conduit. For example, when the flat bottom valve has a footprint of about 1.5 inches square, with a 0.5 inch spacing between the valves, the diameter internal to the seal around the valve port opening is about 0.180 inches, and the diameter of the fluid flow conduit is about 0.152 inches, "$\alpha$" is about 62 degrees. One skilled in the art can calculate what "$\alpha$" will need to be a given valve layout, depending on the variables specified above.

To ensure that there are no cavities or crevices in the area of the "V" drilled conduit, in which particulates can accumulate and subsequently break loose and contaminate a semiconductor part processed using the modular/monolithic gas handling system, it is necessary to polish the interior surface of the fluid flow conduits within the interior of the pump-purge monolithic manifold. Preferably the surface is polished to a finish of 10 RA or better, and more preferably to a finish of 5 RA or better. The preferred method of providing this polished surface is electropolishing. The smaller the angle "$\alpha$", the greater the abrasion of the interior of the "V" drilled conduit adjacent the base of the "V". It is likely there is a minimum "$\alpha$" which is acceptable for a given fluid flow velocity.

The above described preferred embodiments are not intended to limit the scope of the present invention, as one skilled in the art can, in view of the present disclosure, expand such embodiments to correspond with the subject matter of the invention as claimed below.

We claim:

1. An integrated pump-purge apparatus for use in combination with fluid handling systems, comprising:

a plurality of valves mounted on a monolithic manifold, wherein said manifold contains internal fluid transfer conduits which work in conjunction with said plurality of valves and in combination with fluid transfer conduits within a fluid handling system to which said monolithic manifold is attached, to provide both an integrated pump capability and an integrated purge capability through said internal fluid transfer conduits of said manifold and said fluid transfer conduits of said fluid handling system, and wherein said manifold includes a plurality of attachment sites and said fluid handling system includes a plurality of fluid handling modules, with a different fluid handling module attached to each operational attachment site of said manifold.

2. The integrated pump-purge apparatus of claim 1, wherein a fluid flow path between an internal fluid transfer conduit of said manifold and a fluid transfer conduit of a fluid handling module of said fluid handling system is established by bolting or clamping an attachment site of said manifold to an attachment site on a fluid handling module.

3. The integrated pump-purge apparatus of claim 1, wherein there is no closed tolerance loop.

4. An integrated pump-purge apparatus for use in combination with gas handling systems, comprising:

a plurality of valves mounted on a monolithic manifold, wherein said manifold contains internal gas transfer conduits which work in conjunction with said plurality of valves and in combination with gas transfer conduits within a gas handling system to which said monolithic manifold is attached, to provide both an integrated pump capability and an integrated purge capability through said internal gas transfer conduits of said manifold and said gas transfer conduits of said gas handling system, and wherein said manifold includes a plurality of attachment sites and said gas handling system includes a plurality of gas handling modules, with a different gas handling module attached to each operational attachment site of said manifold.

5. The integrated pump-purge apparatus of claim 4, wherein a gas flow path between an internal gas transfer conduit of said manifold and a gas transfer conduit of a gas handling module of said gas handling system is established by bolting or clamping an attachment site of said manifold to an attachment site on a gas handling module.

6. The integrated pump-purge apparatus of claim 4, wherein there is no closed tolerance loop.

7. An integrated pump-purge apparatus for use in combination with fluid handling systems, comprising:

a plurality of valves mounted on a monolithic manifold, wherein said manifold contains internal fluid transfer conduits which work in conjunction with said plurality of valves and in combination with fluid transfer conduits within a fluid handling system to which said monolithic manifold is attached, to provide both an integrated pump capability and an integrated purge capability through said internal fluid transfer conduits of said manifold and said fluid transfer conduits of said fluid handling system, and wherein "V" drilled conduits are used to form at least a portion of said internal fluid transfer conduits within said monolithic manifold, to enable the close placement of a plurality of valves mounted on an exterior surface of said monolithic manifold.

8. The integrated pump-purge apparatus of claim 7, wherein the interior of said "V" drilled conduits is polished to a surface finish of 10 RA or finer.

9. The integrated pump-purge apparatus of claim 8, wherein said surface finish is 5 RA or finer.

10. The apparatus of claim 7, wherein the interior of said "V" drilled conduits is electro polished.

11. An integrated pump-purge apparatus for use in combination with fluid handling systems, comprising:

a plurality of valves mounted on a monolithic manifold, wherein said manifold contains internal fluid transfer conduits which work in conjunction with said plurality of valves and in combination with fluid transfer conduits within a fluid handling system to which said monolithic manifold is attached, to provide both an integrated pump capability and an integrated purge capability through said internal fluid transfer conduits of said manifold and said fluid transfer conduits of said fluid handling system, and wherein a seal between said pump-purge apparatus and said fluid handling system is a "C" seal.

12. An integrated pump-purge apparatus for use in combination with gas handling systems, comprising:

a plurality of valves mounted on a monolithic manifold, wherein said manifold contains internal gas transfer conduits which work in conjunction with said plurality of valves and in combination with gas transfer conduits within a gas handling system to which said monolithic manifold is attached, to provide both an integrated pump capability and an integrated purge capability through said internal gas transfer conduits of said manifold and said gas transfer conduits of said gas handling system, and wherein "V" drilled conduits are used to form at least a portion of said gas transfer conduits within said monolithic manifold, to enable the close placement of a plurality of valves mounted on an exterior surface of said monolithic manifold.

13. The integrated pump-purge apparatus of claim 13, wherein the interior of said "V" drilled conduits is polished to a surface finish of 10 RA or finer.

14. The integrated pump-purge apparatus of claim 13, wherein said surface finish is 5 RA or finer.

15. The apparatus of claim 12, wherein the interior of said "V" drilled conduits is electro polished.

16. An integrated pump-purge apparatus for use in combination with gas handling systems, comprising:

a plurality of valves mounted on a monolithic manifold, wherein said manifold contains internal gas transfer conduits which work in conjunction with said plurality of valves and in combination with gas transfer conduits within a gas handling system to which said monolithic manifold is attached, to provide both an integrated pump capability and an integrated purge capability through said internal gas transfer conduits of said manifold and said gas transfer conduits of said gas handling system, and wherein a seal between said pump-purge apparatus and said gas handling system is a "C" seal.

* * * * *